United States Patent
Honea et al.

(10) Patent No.: US 8,493,129 B2
(45) Date of Patent: Jul. 23, 2013

(54) INDUCTIVE LOAD POWER SWITCHING CIRCUITS

(75) Inventors: James Honea, Santa Barbara, CA (US); Yifeng Wu, Goleta, CA (US)

(73) Assignee: Transphorm Inc., Goleta, CA (US)

( * ) Notice: Subject to any disclaimer, the term of this patent is extended or adjusted under 35 U.S.C. 154(b) by 0 days.

(21) Appl. No.: 13/618,502

(22) Filed: Sep. 14, 2012

(65) Prior Publication Data

US 2013/0009613 A1    Jan. 10, 2013

Related U.S. Application Data

(62) Division of application No. 12/556,438, filed on Sep. 9, 2009, now Pat. No. 8,289,065.

(60) Provisional application No. 61/099,451, filed on Sep. 23, 2008.

(51) Int. Cl.
*H03K 17/56*    (2006.01)

(52) U.S. Cl.
USPC ............ 327/424; 327/423; 327/448; 327/494

(58) Field of Classification Search
USPC .................. 327/365, 374, 392–406, 419–492
See application file for complete search history.

(56) References Cited

U.S. PATENT DOCUMENTS

| | | | |
|---|---|---|---|
| 4,384,287 A | 5/1983 | Sakuma | |
| 4,645,562 A | 2/1987 | Liao et al. | |
| 4,728,826 A | 3/1988 | Einzinger et al. | |
| 4,808,853 A | 2/1989 | Taylor | |
| 4,821,093 A | 4/1989 | Iafrate et al. | |
| 4,914,489 A | 4/1990 | Awano | |
| 5,198,964 A | 3/1993 | Ito et al. | |
| 5,329,147 A | 7/1994 | Vo et al. | |
| 5,379,209 A | 1/1995 | Goff | |
| 5,493,487 A | 2/1996 | Close et al. | |
| 5,637,922 A | 6/1997 | Fillion et al. | |
| 5,646,069 A | 7/1997 | Jelloian et al. | |
| 5,705,847 A | 1/1998 | Kashiwa et al. | |
| 5,714,393 A | 2/1998 | Wild et al. | |
| 5,952,856 A | 9/1999 | Horiguchi et al. | |
| 5,998,810 A | 12/1999 | Hatano et al. | |
| 6,008,684 A | 12/1999 | Ker et al. | |
| 6,097,046 A | 8/2000 | Plumton | |

(Continued)

FOREIGN PATENT DOCUMENTS

| CN | 1748320 | 3/2006 |
|---|---|---|
| CN | 101897029 | 11/2010 |

(Continued)

OTHER PUBLICATIONS

Ando et al., "10-W/mm AlGaN-GaN HFET with a field modulating plate," IEEE Electron Device Letters, 2003, 24(5): 289-291.

(Continued)

*Primary Examiner* — Lincoln Donovan
*Assistant Examiner* — Brandon S Cole
(74) *Attorney, Agent, or Firm* — Fish & Richardson P.C.

(57) ABSTRACT

Power switching circuits including an inductive load and a switching device are described. The switches devices can be either low-side or high-side switches. Some of the switches are transistors that are able to block voltages or prevent substantial current from flowing through the transistor when voltage is applied across the transistor.

28 Claims, 9 Drawing Sheets

U.S. PATENT DOCUMENTS

| | | | |
|---|---|---|---|
| 6,107,844 | A | 8/2000 | Berg et al. |
| 6,130,831 | A | 10/2000 | Matsunaga |
| 6,172,550 | B1 * | 1/2001 | Gold et al. ............... 327/366 |
| 6,316,793 | B1 | 11/2001 | Sheppard et al. |
| 6,333,617 | B1 | 12/2001 | Itabashi et al. |
| 6,395,593 | B1 | 5/2002 | Pendharkar et al. |
| 6,475,889 | B1 | 11/2002 | Ring |
| 6,486,502 | B1 | 11/2002 | Sheppard et al. |
| 6,515,303 | B2 | 2/2003 | Ring |
| 6,521,940 | B1 | 2/2003 | Vu et al. |
| 6,548,333 | B2 | 4/2003 | Smith |
| 6,583,454 | B2 | 6/2003 | Sheppard et al. |
| 6,586,781 | B2 | 7/2003 | Wu et al. |
| 6,649,497 | B2 | 11/2003 | Ring |
| 6,650,169 | B2 * | 11/2003 | Faye et al. ............... 327/404 |
| 6,727,531 | B1 | 4/2004 | Redwing et al. |
| 6,777,278 | B2 | 8/2004 | Smith |
| 6,781,423 | B1 | 8/2004 | Knoedgen |
| 6,849,882 | B2 | 2/2005 | Chavarkar et al. |
| 6,867,078 | B1 | 3/2005 | Green et al. |
| 6,900,657 | B2 | 5/2005 | Bui et al. |
| 6,946,739 | B2 | 9/2005 | Ring |
| 6,979,863 | B2 | 12/2005 | Ryu |
| 6,982,204 | B2 | 1/2006 | Saxler et al. |
| 7,030,428 | B2 | 4/2006 | Saxler |
| 7,045,404 | B2 | 5/2006 | Sheppard et al. |
| 7,071,498 | B2 | 7/2006 | Johnson et al. |
| 7,084,475 | B2 | 8/2006 | Shelton et al. |
| 7,116,567 | B2 | 10/2006 | Shelton et al. |
| 7,125,786 | B2 | 10/2006 | Ring et al. |
| 7,161,194 | B2 | 1/2007 | Parikh et al. |
| 7,170,111 | B2 | 1/2007 | Saxler |
| 7,230,284 | B2 | 6/2007 | Parikh et al. |
| 7,238,560 | B2 | 7/2007 | Sheppard et al. |
| 7,253,454 | B2 | 8/2007 | Saxler |
| 7,265,399 | B2 | 9/2007 | Sriram et al. |
| 7,268,375 | B2 | 9/2007 | Shur et al. |
| 7,304,331 | B2 | 12/2007 | Saito et al. |
| 7,321,132 | B2 | 1/2008 | Robinson et al. |
| 7,326,971 | B2 | 2/2008 | Harris et al. |
| 7,332,795 | B2 | 2/2008 | Smith et al. |
| 7,364,988 | B2 | 4/2008 | Harris et al. |
| 7,378,883 | B1 | 5/2008 | Hsueh |
| 7,388,236 | B2 | 6/2008 | Wu et al. |
| 7,419,892 | B2 | 9/2008 | Sheppard et al. |
| 7,432,142 | B2 | 10/2008 | Saxler et al. |
| 7,443,648 | B2 | 10/2008 | Cutter et al. |
| 7,456,443 | B2 | 11/2008 | Saxler et al. |
| 7,465,967 | B2 | 12/2008 | Smith et al. |
| 7,477,082 | B2 | 1/2009 | Fukazawa |
| 7,501,669 | B2 | 3/2009 | Parikh et al. |
| 7,544,963 | B2 | 6/2009 | Saxler |
| 7,548,112 | B2 | 6/2009 | Sheppard |
| 7,550,783 | B2 | 6/2009 | Wu et al. |
| 7,550,784 | B2 | 6/2009 | Saxler et al. |
| 7,566,918 | B2 | 7/2009 | Wu et al. |
| 7,573,078 | B2 | 8/2009 | Wu et al. |
| 7,592,211 | B2 | 9/2009 | Sheppard et al. |
| 7,612,390 | B2 | 11/2009 | Saxler et al. |
| 7,612,602 | B2 * | 11/2009 | Yang et al. ............... 327/494 |
| 7,615,774 | B2 | 11/2009 | Saxler |
| 7,638,818 | B2 | 12/2009 | Wu et al. |
| 7,639,064 | B2 | 12/2009 | Hsiao et al. |
| 7,678,628 | B2 | 3/2010 | Sheppard et al. |
| 7,692,263 | B2 | 4/2010 | Wu et al. |
| 7,709,269 | B2 | 5/2010 | Smith et al. |
| 7,709,859 | B2 | 5/2010 | Smith et al. |
| 7,719,055 | B1 | 5/2010 | McNutt et al. |
| 7,745,851 | B2 | 6/2010 | Harris |
| 7,746,020 | B2 | 6/2010 | Schnetzka et al. |
| 7,777,252 | B2 | 8/2010 | Sugimoto et al. |
| 7,804,328 | B2 | 9/2010 | Pentakota et al. |
| 7,812,369 | B2 | 10/2010 | Chini et al. |
| 7,851,825 | B2 | 12/2010 | Suh et al. |
| 7,855,401 | B2 | 12/2010 | Sheppard et al. |
| 7,875,537 | B2 | 1/2011 | Suvorov et al. |
| 7,875,907 | B2 | 1/2011 | Honea et al. |
| 7,875,914 | B2 | 1/2011 | Sheppard |
| 7,892,974 | B2 | 2/2011 | Ring et al. |
| 7,893,500 | B2 | 2/2011 | Wu et al. |
| 7,901,994 | B2 | 3/2011 | Saxler et al. |
| 7,906,799 | B2 | 3/2011 | Sheppard et al. |
| 7,915,643 | B2 | 3/2011 | Suh et al. |
| 7,915,644 | B2 | 3/2011 | Wu et al. |
| 7,919,791 | B2 | 4/2011 | Flynn et al. |
| 7,920,013 | B2 * | 4/2011 | Sachdev et al. ............... 327/379 |
| 7,928,475 | B2 | 4/2011 | Parikh et al. |
| 7,955,918 | B2 | 6/2011 | Wu et al. |
| 7,960,756 | B2 | 6/2011 | Sheppard et al. |
| 7,965,126 | B2 | 6/2011 | Honea et al. |
| 7,985,986 | B2 | 7/2011 | Heikman et al. |
| 8,013,580 | B2 * | 9/2011 | Cervera et al. ............... 323/268 |
| 8,049,252 | B2 | 11/2011 | Smith et al. |
| 2001/0032999 | A1 | 10/2001 | Yoshida |
| 2001/0040247 | A1 | 11/2001 | Ando et al. |
| 2002/0036287 | A1 | 3/2002 | Yu et al. |
| 2002/0121648 | A1 | 9/2002 | Hsu et al. |
| 2002/0125920 | A1 | 9/2002 | Stanley |
| 2002/0167023 | A1 | 11/2002 | Chavarkar et al. |
| 2003/0006437 | A1 | 1/2003 | Mizuta et al. |
| 2003/0020092 | A1 | 1/2003 | Parikh et al. |
| 2003/0178654 | A1 | 9/2003 | Thornton |
| 2004/0041169 | A1 | 3/2004 | Ren et al. |
| 2004/0061129 | A1 | 4/2004 | Saxler et al. |
| 2004/0164347 | A1 | 8/2004 | Zhao et al. |
| 2004/0178831 | A1 | 9/2004 | Li et al. |
| 2005/0052221 | A1 * | 3/2005 | Kohnotoh et al. ............... 327/536 |
| 2005/0067716 | A1 | 3/2005 | Mishra et al. |
| 2005/0077541 | A1 | 4/2005 | Shen et al. |
| 2005/0077947 | A1 | 4/2005 | Munzer et al. |
| 2005/0133816 | A1 | 6/2005 | Fan et al. |
| 2005/0146310 | A1 | 7/2005 | Orr |
| 2005/0189561 | A1 | 9/2005 | Kinzer et al. |
| 2005/0189562 | A1 | 9/2005 | Kinzer et al. |
| 2005/0194612 | A1 | 9/2005 | Beach |
| 2005/0218964 | A1 * | 10/2005 | Oswald et al. ............... 327/493 |
| 2005/0253168 | A1 | 11/2005 | Wu et al. |
| 2006/0011915 | A1 | 1/2006 | Saito et al. |
| 2006/0033122 | A1 | 2/2006 | Pavier et al. |
| 2006/0043499 | A1 | 3/2006 | De Cremoux et al. |
| 2006/0060871 | A1 | 3/2006 | Beach |
| 2006/0102929 | A1 | 5/2006 | Okamoto et al. |
| 2006/0108602 | A1 | 5/2006 | Tanimoto |
| 2006/0121682 | A1 | 6/2006 | Saxler |
| 2006/0124962 | A1 | 6/2006 | Ueda et al. |
| 2006/0157729 | A1 | 7/2006 | Ueno et al. |
| 2006/0176007 | A1 | 8/2006 | Best |
| 2006/0186422 | A1 | 8/2006 | Gaska et al. |
| 2006/0189109 | A1 | 8/2006 | Fitzgerald |
| 2006/0202272 | A1 | 9/2006 | Wu et al. |
| 2006/0220063 | A1 | 10/2006 | Kurachi et al. |
| 2006/0237825 | A1 | 10/2006 | Pavier et al. |
| 2006/0238234 | A1 | 10/2006 | Benelbar et al. |
| 2006/0255364 | A1 | 11/2006 | Saxler et al. |
| 2006/0261473 | A1 | 11/2006 | Connah et al. |
| 2006/0289901 | A1 | 12/2006 | Sheppard et al. |
| 2007/0007547 | A1 | 1/2007 | Beach |
| 2007/0018187 | A1 | 1/2007 | Lee et al. |
| 2007/0018199 | A1 | 1/2007 | Sheppard et al. |
| 2007/0018210 | A1 | 1/2007 | Sheppard |
| 2007/0045670 | A1 | 3/2007 | Kuraguchi |
| 2007/0080672 | A1 * | 4/2007 | Yang ............... 323/282 |
| 2007/0090373 | A1 * | 4/2007 | Beach et al. ............... 257/79 |
| 2007/0128743 | A1 | 6/2007 | Huang et al. |
| 2007/0132037 | A1 | 6/2007 | Hoshi et al. |
| 2007/0134834 | A1 | 6/2007 | Lee et al. |
| 2007/0145390 | A1 | 6/2007 | Kuraguchi |
| 2007/0146045 | A1 | 6/2007 | Koyama |
| 2007/0158692 | A1 | 7/2007 | Nakayama et al. |
| 2007/0164315 | A1 | 7/2007 | Smith et al. |
| 2007/0164322 | A1 | 7/2007 | Smith et al. |
| 2007/0194354 | A1 | 8/2007 | Wu et al. |
| 2007/0205433 | A1 | 9/2007 | Parikh et al. |
| 2007/0224710 | A1 | 9/2007 | Palacios et al. |
| 2007/0228477 | A1 | 10/2007 | Suzuki et al. |
| 2007/0278518 | A1 | 12/2007 | Chen et al. |
| 2008/0017998 | A1 | 1/2008 | Pavio |

| | | | | | | | |
|---|---|---|---|---|---|---|---|
| 2008/0018366 | A1* | 1/2008 | Hanna ............ 327/112 | TW | 201143017 | | 12/2011 |
| 2008/0073670 | A1 | 3/2008 | Yang et al. | WO | WO 2007/077666 | | 7/2007 |
| 2008/0093626 | A1 | 4/2008 | Kuraguchi | WO | WO 2007/108404 | | 9/2007 |
| 2008/0122418 | A1 | 5/2008 | Briere et al. | WO | WO 2008/120094 | | 10/2008 |
| 2008/0136390 | A1 | 6/2008 | Briere | WO | WO 2009/036181 | | 3/2009 |
| 2008/0157121 | A1 | 7/2008 | Ohki | WO | WO 2009/036266 | | 3/2009 |
| 2008/0158110 | A1 | 7/2008 | Iida et al. | WO | WO 2009/039028 | | 3/2009 |
| 2008/0191342 | A1 | 8/2008 | Otremba | WO | WO 2009/039041 | | 3/2009 |
| 2008/0203430 | A1 | 8/2008 | Simin et al. | WO | WO 2009/076076 | | 6/2009 |
| 2008/0203559 | A1 | 8/2008 | Lee et al. | WO | WO 2009/102732 | | 8/2009 |
| 2008/0230784 | A1 | 9/2008 | Murphy | WO | WO 2009/132039 | | 10/2009 |
| 2008/0237606 | A1 | 10/2008 | Kikkawa et al. | WO | WO 2010/039463 | | 4/2010 |
| 2008/0237640 | A1 | 10/2008 | Mishra et al. | WO | WO 2010/068554 | | 6/2010 |
| 2008/0248634 | A1 | 10/2008 | Beach | WO | WO 2010/090885 | | 8/2010 |
| 2008/0272404 | A1 | 11/2008 | Kapoor | WO | WO 2010/132587 | | 11/2010 |
| 2008/0274574 | A1 | 11/2008 | Yun | WO | WO 2011/031431 | | 3/2011 |
| 2008/0283844 | A1 | 11/2008 | Hoshi et al. | WO | WO 2011/053981 | | 5/2011 |
| 2008/0308813 | A1 | 12/2008 | Suh et al. | WO | WO 2011/072027 | | 6/2011 |
| 2009/0032820 | A1 | 2/2009 | Chen | WO | WO 2011/085260 | | 7/2011 |
| 2009/0032879 | A1 | 2/2009 | Kuraguchi | WO | WO 2011/097302 | | 8/2011 |
| 2009/0045438 | A1 | 2/2009 | Inoue et al. | | | | |
| 2009/0065810 | A1 | 3/2009 | Honea et al. | | | | |
| 2009/0072269 | A1 | 3/2009 | Suh et al. | | | | |
| 2009/0085065 | A1 | 4/2009 | Mishra et al. | | | | |
| 2009/0167411 | A1 | 7/2009 | Machida et al. | | | | |
| 2009/0180304 | A1 | 7/2009 | Bahramian et al. | | | | |
| 2009/0201072 | A1 | 8/2009 | Honea et al. | | | | |
| 2009/0215230 | A1 | 8/2009 | Muto et al. | | | | |
| 2009/0236728 | A1 | 9/2009 | Satou et al. | | | | |
| 2009/0278513 | A1 | 11/2009 | Bahramian et al. | | | | |
| 2009/0315594 | A1 | 12/2009 | Pentakota et al. | | | | |
| 2010/0067275 | A1 | 3/2010 | Wang et al. | | | | |
| 2010/0073067 | A1 | 3/2010 | Honea | | | | |
| 2010/0097119 | A1 | 4/2010 | Ma et al. | | | | |
| 2010/0117095 | A1 | 5/2010 | Zhang | | | | |
| 2011/0006346 | A1 | 1/2011 | Ando et al. | | | | |
| 2011/0012110 | A1 | 1/2011 | Sazawa et al. | | | | |
| 2011/0019450 | A1 | 1/2011 | Callanan et al. | | | | |
| 2011/0025397 | A1 | 2/2011 | Wang et al. | | | | |
| 2011/0121314 | A1 | 5/2011 | Suh et al. | | | | |
| 2011/0169549 | A1 | 7/2011 | Wu | | | | |

FOREIGN PATENT DOCUMENTS

| | | |
|---|---|---|
| CN | 101978589 | 2/2011 |
| CN | 102017160 | 4/2011 |
| CN | 102165694 | 8/2011 |
| CN | 102308387 | 1/2012 |
| EP | 1 998 376 | 12/2008 |
| EP | 2 188 842 | 5/2010 |
| EP | 2 243 213 | 10/2010 |
| JP | 5-075040 | 3/1993 |
| JP | 6-067744 | 3/1994 |
| JP | 2000-058871 | 2/2000 |
| JP | 2000-101356 | 4/2000 |
| JP | 2000-124358 | 4/2000 |
| JP | 2003-229566 | 8/2003 |
| JP | 2003-244943 | 8/2003 |
| JP | 2003-338742 | 11/2003 |
| JP | 2004-260114 | 9/2004 |
| JP | 2004-281454 | 10/2004 |
| JP | 2006-032749 | 2/2006 |
| JP | 2006-033723 | 2/2006 |
| JP | 2006-173754 | 6/2006 |
| JP | 2007-036218 | 2/2007 |
| JP | 2007-215331 | 8/2007 |
| JP | 2007-294769 | 11/2007 |
| JP | 2008-199771 | 8/2008 |
| JP | 2010-539712 | 12/2010 |
| JP | 2011-512119 | 4/2011 |
| JP | 2012-517699 | 8/2012 |
| TW | 200924068 | 6/2009 |
| TW | 200924201 | 6/2009 |
| TW | 200941920 | 10/2009 |
| TW | 200947703 | 11/2009 |
| TW | 201010076 | 3/2010 |
| TW | 201027759 | 7/2010 |
| TW | 201027912 | 7/2010 |
| TW | 201036155 | 10/2010 |
| TW | 201126686 | 8/2011 |

OTHER PUBLICATIONS

Arulkumaran et al. (2005), "Enhancement of breakdown voltage by AlN buffer layer thickness in AlGaN/GaN high-electron-mobility transistors on 4 in. diameter silicon," Applied Physics Letters, 86:123503-1-3.

Authorized officer Chung Keun Lee, International Search Report and Written Opinion in PCT/US2008/076079, mailed Mar. 20, 2009, 11 pp.

Authorized officer Nora Lindner, International Preliminary Report on Patentability in PCT/US2008/076079, mailed Apr. 1, 2010, 6 pp.

Authorized officer Keon Hyeong Kim, International Search Report and Written Opinion in PCT/US2008/076160 mailed Mar. 18, 2009, 11 pp.

Authorized officer Simin Baharlou, International Preliminary Report on Patentability in PCT/US2008/076160, mailed Mar. 25 2010, 6 pp.

Authorized officer Chung Keun Lee, International Search Report and Written Opinion in PCT/US2008/076199, mailed Mar. 24, 2009, 11 pp.

Authorized officer Dorothée Mülhausen, International Preliminary Report on Patentability in PCT/US2008/076199, mailed Apr. 1, 2010, 6 pp.

Authorized officer Keon Hyeong Kim, International Search Report and Written Opinion in PCT/US2008/085031, mailed Jun. 24, 2009, 11 pp.

Authorized officer Yolaine Cussac, International Preliminary Report on Patentability in PCT/US2008/085031, mailed Jun. 24, 2010, 6 pp.

Authorized officer Jae Woo Wee, International Search Report and Written Opinion in PCT/US2009/033699, mailed Sep. 21, 2009, 11 pp.

Authorized officer Dorothée Mülhausen, International Preliminary Report on Patentability in PCT/US2009/033699, mailed Aug. 26, 2010, 6 pp.

Authorized officer Tae Hoon Kim, International Search Report and Written Opinion in PCT/US2009/041304, mailed Dec. 18, 2009, 13 pp.

Authorized officer Dorothée Mülhausen, International Preliminary Report on Patentability in PCT/US2009/041304, mailed Nov. 4, 2010, 8 pp.

Authorized officer Sung Hee Kim, International Search Report and the Written Opinion in PCT/US2009/057554, mailed May 10, 2010, 13 pp.

Authorized Officer Gijsbertus Beijer, International Preliminary Report on Patentability in PCT/US2009/057554, mailed Mar. 29, 2011, 7 pp.

Authorized officer Cheon Whan Cho, International Search Report and Written Opinion in PCT/US2009/066647, mailed Jul. 1, 2010, 16 pp.

Authorized officer Athina Nickitas-Etienne, International Preliminary Report on Patentability in PCT/US2009/066647, mailed Jun. 23, 2011, 12 pp.

Authorized officer Chung Keun Lee, International Search Report and Written Opinion in PCT/US2009/076030, mailed Mar. 23, 2009, 10 pp.

Authorized officer Yolaine Cussac, International Preliminary Report on Patentability in PCT/US2009/076030, mailed Mar. 25, 2010, 5 pp.

Authorized officer Sung Chan Chung, International Search Report and Written Opinion for PCT/US2010/021824, mailed Aug. 23, 2010, 9 pp.

Authorized officer Beate Giffo-Schmitt, International Preliminary Report on Patentability in PCT/US2010/021824, mailed Aug. 23, 2010, 6 pp.

Authorized officer Sang Ho Lee, International Search Report and Written Opinion in PCT/US2010/034579, mailed Dec. 24, 2010, 9 pp.

Authorized officer Nora Lindner, International Preliminary Report on Patentability in PCT/US2010/034579, mailed Nov. 24, 2011, 7 pp.

Authorized officer Jeongmin Choi, International Search Report and Written Opinion in PCT/US2010/046193, mailed Apr. 26, 2011, 13 pp.

Authorized officer Bon Gyoung Goo, International Search Report and Written Opinion in PCT/US2010/055129, mailed Jul. 1, 2011, 11 pp.

Authorized officer Sang Ho Lee, International Search Report and Written Opinion in PCT/US2010/059486, mailed Jul. 26, 2011, 9 pp.

Authorized officer Kee Young Park, International Search Report and Written Opinion in PCT/US2011/023485, mailed Sep. 23 2011, 10 pp.

Arulkumaran et al., "Surface passivation effects on AlGaN/GaN high-electron-mobility transistors with $SiO_2$, $Si_3N_4$, and silicon oxynitride," Applied Physics Letters, Jan. 26, 2004, 84(4): 613-615.

Barnett and Shinn (1994), "Plastic and elastic properties of compositionally modulated thin films," Annu. Rev. Mater. Sci., 24:481-511.

Chen et al "High-performance AlGaN/GaN lateral field-effect rectifiers compatible with high electron mobility transistors," Jun. 25, 2008, Applied Physics Letters, 92, 253501-1-3.

Chu et al., "1200-V normally off GaN-on-Si field-effect transistors with low dynamic on-resistance," IEEE Electron Device Letters, 2011, 32(5): 632-634.

Cheng et al. (2006), "Flat GaN epitaxial layers grown on Si(111) by metalorganic vapor phase epitaxy using step-graded AlGaN intermediate layers," Journal of Electronic Materials, 35(4):592-598.

Coffie, R.L., "Characterizing and suppressing DC-to-RF dispersion in AlGaN/GaN high electron mobility transistors," 2003, PhD Thesis, University of California, Santa Barbara, 169 pp.

Coffie et al. (2003), "Unpassivated p-GaN/AlGaN/GaN HEMTs with 7.1 W/mm at 10 GhZ," Electronic Letters, 39(19):1419-1420.

Dora et al., "High breakdown voltage achieved on AlGaN/GaN HEMTs with integrated slant field plates," Sep. 9, 2006, IEEE Electron Device Letters, 27(9):713-715.

Dora et al., "$ZrO_2$ gate dielectrics produced by ultraviolet ozone oxidation for GaN and AlGaN/GaN transistors," Mar./Apr. 2006, J. Vac. Sci. Technol. B, 24(2):575-581.

Dora, Y., "Understanding material and process limits for high breakdown voltage AlGaN/GaN HEMs," 2006, PhD Thesis, University of California, Santa Barbara, 157 pp.

Fanciulli et al., "Structural and electrical properties of HfO2 films grown by atomic layer deposition on Si, Ge, GaAs and GaN," 2004, Mat. Res. Soc. Symp. Proc., vol. 786, 6 pp.

Green et al., "The effect of surface passivation on the microwave characteristics of undoped AlGaN/GaN HEMT's," IEEE Electron Device Letters, Jun. 2000, 21(6):268-270.

Gu et al., "AlGaN/GaN MOS transistors using crystalline $ZrO_2$ as gate dielectric," 2007, Proceedings of SPIE, vol. 6473, 64730S-1-8.

Higashiwaki et al., "AlGaN/GaN heterostructure field-effect transistors on 4H-SiC substrates with current-gain cutoff frequency of 190 GHz," Applied Physics Express, 2008, 1:021103-1-3.

Hwang, J., "Effects of a molecular beam epitaxy grown AlN passivation layer on AlGaN/GaN heterojunction field effect transistors," Solid-State Electronics, 2004, 48:363-366.

Im et al., "Normally off GaN MOSFET based on AlGaN/GaN heterostructure with extremely high 2DEG density grown on silicon substrate," IEEE Electron Device Letters, 2010, 31(3):192-194.

Karmalkar and Mishra (2001), "Enhancement of breakdown voltage in AlGaN/GaN high electron mobility transistors using a field plate," IEEE Transactions on Electron Devices, 48(8):1515-1521.

Karmalkar and Mishra, "Very high voltage AlGaN/GaN high electron mobility transistors using a field plate deposited on a stepped insulator," Solid-State Electronics, 2001, 45:1645-1652.

Keller et al. (2002), "GaN-GaN junctions with ultrathin AlN interlayers: expanding heterojunction design," Applied Physics Letters, 80(23):4387-4389.

Keller et al., "Method for heteroepitaxial growth of high quality N-Face GaN, InN and AlN and their alloys by metal organic chemical vapor deposition," U.S. Appl. No. 60/866,035, filed Nov. 15, 2006, 31 pp.

Khan et al., "AlGaN/GaN metal oxide semiconductor heterostructure field effect transistor," IEEE Electron Device Letters, 2000, 21(2):63-65.

Kim, D.H., "Process development and device characteristics of AlGaN/GaN HEMTs for high frequency applications," 2007, PhD Thesis, University of Illinois, Urbana-Champaign, 120 pp.

Kumar et al., "High transconductance enhancement-mode AlGaN/GaN HEMTs on SiC substrate," Electronics Letters, Nov. 27, 2003, 39(24):1758-1760.

Kuraguchi et al. (2007), "Normally-off GaN-MISFET with well-controlled threshold voltage," Phys. Stats. Sol., 204(6):2010-2013.

Lanford et al., "Recessed-gate enhancement-mode GaN HEMT with high threshold voltage," Mar. 31, 2005, Electronics Letters, vol. 41, No. 7, 2 pp., Online No. 20050161.

Lee et al. (2001), "Self-aligned process for emitter- and base-regrowth GaN HBTs and BJTs," Solid-State Electronics, 45:243-247.

Marchand et al. (2001), "Metalorganic chemical vapor deposition of GaN on Si(111): stress control and application to field-effect transistors," Journal of Applied Physics, 89(12):7846-7851.

Mishra et al., "AlGaN/GaN HEMTs—an overview of device operation and applications," Proceedings of the IEEE, 2002, 90(6):1022-1031.

Mishra et al., "Growing N-polar III-nitride structures," U.S. Appl. No. 60/972,467, filed Sep. 14, 2007, 7 pp.

Mishra et al., "N-face high electron mobility transistors with low buffer leakage and low parasitic resistance," U.S. Appl. No. 60/908,914, filed Mar. 29, 2007, 21 pp.

Mishra et al., "Polarization-induced barriers for n-face nitride-based electronics," U.S. Appl. No. 60/940,052, filed May 24, 2007, 29 pp.

Nanjo et al., "Remarkable breakdown voltage enhancement in AlGaN channel high electron mobility transistors," Applied Physics Letters, 2008, 92:263502-1-3.

Ota and Nozawa (2008), "AlGaN/GaN recessed MIS-Gate HFET with high threshold-voltage normally-off operation for power electronics applications," IEEE Electron Device Letters, 29(7):668-670.

Palacios et al., "Fluorine treatment to shape the electric field in electron devices, passivate dislocations and point defects, and enhance the luminescence efficiency of optical devices," U.S. Appl. No. 60/736,628, filed Nov. 15, 2005, 21 pp.

Palacios et al. (2006), "Nitride-based high electron mobility transistors with a GaN spacer," Applied Physics Letters, 89:073508-1-3.

Palacios et al., "AlGaN/GaN HEMTs with an InGaN-based back-barrier," Device Research Conference Digest, 200, DRC '05 63rd, Jun. 2005, pp. 181-182.

Palacios et al., "AlGaN/GaN high electron mobility transistors with InGaN back-barriers," IEEE Electron Device Letters, 2006, 27(1):13-15.

Pei et al., "Effect of dielectric thickness on power performance of AlGaN/GaN HEMTs," IEEE Electron Device Letters, 2009, 30:4:313-315-.

Planar, Low Switching Loss, Gallium Nitride Devices for Power Conversion Applications, SBIR N121-090 (Navy), 3 pp.

Rajan et al., "Advanced transistor structures based on N-face GaN," 32M International Symposium on Compound Semiconductors (ISCS), Sep. 18-22, 2005, Europa-Park Rust, Germany, 2 pp.

Reiher et al. (2003), "Efficient stress relief in GaN heteroepitaxy on SiC (111) using low-temperature AlN interlayers," Journal of Crystal Growth, 248:563-567.

Saito et al., "Recess-gate structure approach toward normally off high-voltage AlGaN/GaN HEMT for power electronics applications," Feb. 2006, IEEE Transactions on Electron Device, 53(2):356-362.

Shelton et al., "Selective area growth and characterization of AlGaN/GaN heterojunction bipolar transistors by metalorganic chemical vapor deposition," IEEE Transactions on Electron Devices, 2001, 48(3):490-494.

Shen, L., "Advanced polarization-based design of AlGaN/GaN HEMTs," Jun. 2004, PhD Thesis, University of California, Santa Barbara, 192 pp.

SIPO First Office Action for Application No. 200880120050.6, Aug. 2, 2011, 8 pp.

Sugiura et al., "Enhancement-mode $n$-channel GaN MOSFETs fabricated on $p$-GaN using $HfO_2$ as gate oxide," Aug. 16, 2007, Electronics Letters, vol. 43, No. 17, 2 pp.

Suh et al., "High breakdown enhancement mode GaN-based HEMTs with integrated slant field plate," U.S. Appl. No. 60/822,886, filed Aug. 18, 2006, 16 pp.

Suh et al., "III-nitride devices with recessed gates," U.S. Appl. No. 60/972,481, filed Sep. 14, 2007, 18 pp.

Suh, et al. "High-breakdown enhancement-mode AlGaN/GaN HEMTs with integrated slant field-plate," Electron Devices Meeting, 2006. IEDM '06. International (2006), 3 pp.

Tipirneni et al., "Silicon dioxide-encapsulated high-voltage AlGaN/GaN HFETs for power-switching applications," IEEE Electron Device Letters, 28(9):784-786.

Vetury et al. (1998), "Direct measurement of gate depletion in high breakdown (405V) Al/GaN/GaN heterostructure field effect transistors," IEDM 98, pp. 55-58.

Wang et al., "Comparison of the effect of gate dielectric layer on 2DEG carrier concentration in strained AlGaN/GaN heterostructure," 2005, Mater. Res. Soc. Symp. Proc., vol. 831, 6 pp.

Wang et al., "Enhancement-mode $Si_3N_4$/AlGaN/GaN MISHFETs," IEEE Electron Device Letters, 2006, 27(10):793-795.

Wu et al., "A 97.8% efficient GaN HEMT boost converter with 300-W output power at 1MHz," Aug. 2008, Electronic Device Letters, IEEE, 29(8):824-826.

Wu, Y., AlGaN/GaN micowave power high-mobility transistors, 1997, PhD Thesis, University of California, Santa Barbara, 134 pp.

Yoshida, S., "AlGan/GaN power FET," Furukawa Review, 21:7-11, 2002.

Zhang, N., "High voltage GaN HEMTs with low on-resistance for switching applications," 2002, PhD Thesis, University of California, Santa Barbara, 166 pp.

Authorized officer Sung Joon Lee, International Search Report and Written Opinion in PCT/US2011/020592, mailed Sep. 19, 2011, 9 pages.

Authorized officer Philippe Bécamel, International Preliminary Report on Patentability in PCT/US2011/020592, mailed Jul. 19, 2012, 7 pages.

Authorized officer Nora Lindner, International Preliminary Report on Patentability in PCT/US2011/023485, mailed Aug. 16, 2012, 7 pages.

Chen, et al., "Single-Chip Boost Converter Using Monolithically Integrated AlGan/GaN Lateral Field-Effect Rectifier and Normally Off HEMT," IEEE Electron Device Letters, May 2009, 30(5):430-432.

Authorized officer In Gu Kwak, International Search Report and Written Opinion in PCT/US2012/026810, mailed Jan. 23, 2013, 10 pages.

Napierala, et al., Selective GaN Epitaxy on Si(111) Substrates Using Porous Aluminum Oxide Buffer Layers, J. Electrochem. Soc., 2006, 153(2):G125-127.

TW Search Report and Action in Application No. 098132132, issued Dec. 6, 2012, 8 pages.

Transphorm, Inc. Taiwanese Patent Application No. 101146143, filed Dec. 7, 2012, entitled "Semiconductor Modules and Methods of Forming the Same". English translation of U.S. Appl. No. 61/568,022, 39 pages.

Search report and action for Taiwan Invention Application No. 098132132, filed Sep. 23, 2009. Dated Dec. 10, 2012. 8 pages.

International Search Report and Written Opinion for International Application No. PCT/US2012/026810, filed Feb. 27, 2012. Received Jan. 23, 2013. 10 pages.

J. Napierala, H.-J. Bohlmann and M. Ilegems. Selective GaN Epitaxy on Si(111) Substrates Using Porous Aluminum Oxide Buffer Layers. Journal of the Electrochemical Society. vol. 153, issue 2. Published 2006. pp. G125-G127.

\* cited by examiner

INDUCTIVE LOAD POWER SWITCHING CIRCUITS

CROSS-REFERENCE TO RELATED APPLICATIONS

This application is a divisional of U.S. application Ser. No. 12/556,438, filed on Sep. 9, 2009, which claims priority to U.S. Provisional Application No. 61/099,451, filed on Sep. 23, 2008. The disclosures of the prior applications are considered part of and are incorporated by reference in the disclosure of this application.

TECHNICAL FIELD

This invention relates to power switching circuits, specifically ones for which an inductive load is used.

BACKGROUND

A single-sided switch is a switching configuration where a switching device is used either to connect the load to a node at a lower potential—a "low-side" switch—or to a node at a higher potential—a "high-side" switch. The low-side configuration is shown in FIG. 1a, and the high-side configuration is shown in FIG. 2a, where the node at higher potential is represented by a high voltage (HV) source and the node at lower potential is represented by a ground terminal. In both cases, when the load 10 is an inductive load, a freewheeling diode 11 (sometimes referred to as a flyback diode) is required to provide a path for the freewheeling load current when the switching device is OFF. For example, as seen in FIG. 1b, when the switching device 12 is biased high by applying a gate-source voltage $V_{gs}$ greater than the device threshold voltage $V_{th}$, current 13 flows through the load 10 and through switching device 12, and diode 11 is reverse biased such that no significant current passes through it. When switching device 12 is switched to low by applying a gate-source voltage $V_{gs}<V_{th}$, as shown in FIG. 1c, the current passing through the inductive load 10 cannot terminate abruptly, and so current 13 flows through the load 10 and through diode 11, while no significant current flows through switching device 12. Similar diagrams detailing current flow through the high-side switching configuration when the switch is biased high and when the switch is turned off (switched low) are shown in FIGS. 2b and 2c, respectively.

Ideally, the freewheeling diodes 11 used in the circuits of FIGS. 1 and 2 have low conduction loss in the ON state as well as good switching characteristics to minimize transient currents during switching, therefore Schottky diodes are commonly used. However, for some applications Schottky diodes cannot support large enough reverse-bias voltages, so high-voltage diodes which exhibit higher conduction and switching losses must be used. Switching devices 12, which are usually transistors, may be enhancement mode (normally off, $V_{th}>0$), also known as E-mode, or depletion mode (normally on, $V_{th}<0$), also known as D-mode, devices. In power circuits, enhancement mode devices are typically used to prevent accidental turn on, in order to avoid damage to the devices or other circuit components. A key issue with the circuits in FIGS. 1 and 2 is that most high voltage diodes typically exhibit high conduction and switching loss. Further, reverse recovery currents in high-voltage PIN diodes add to the losses of the transistor.

An alternative to the configurations illustrated in FIGS. 1 and 2 is to instead use synchronous rectification, as illustrated in FIGS. 3a-e. FIG. 3a is the same as FIG. 2a, except that a high-voltage metal-oxide-semiconductor (MOS) transistor 61 is included anti-parallel with diode 11. A standard MOS transistor inherently contains an anti-parallel parasitic diode and can therefore be represented as a transistor 62 anti-parallel to a diode 63, as illustrated in FIG. 3a. As seen in FIG. 3b, when switching device 12 is biased high and MOS transistor 61 is biased low, MOS transistor 61 and diode 11 both block a voltage equal to that across the load, so that the entire current 13 flows through the load 10 and through switching device 12. When switching device 12 is switched to low, as shown in FIG. 3c, diode 11 prevents transistor 62 and parasitic diode 63 from turning on by clamping the gate-drain voltage to a value less than $V_{th}$ of the transistor and less than the turn-on voltage of the parasitic diode. Therefore, almost all of the freewheeling current flows through diode 11, while only a small, insignificant portion flows through the transistor channel and parasitic diode. As shown in FIG. 3d, MOS device 61 may then be biased high, which results in an increase in the channel conductivity of transistor 62 and thereby cause the majority of the freewheeling current to flow through the transistor channel. However, some dead time must be provided between turn-off of switching device 12 and turn-on of transistor 62 in order to avoid shoot-through currents from the high-voltage supply (HV) to ground. Therefore, diode 11 will be turned on for some time immediately after switching device 12 is switched from high to low and immediately before switching device 12 is switched back from low to high. While this reduces the conduction losses incurred by diode 11 in the absence of MOS transistor 61, the full switching loss for diode 11 is incurred, regardless of how long the diode remains on.

As shown in FIG. 3e, the circuit in FIGS. 3a-d can in principle operate without diode 11. In this case, parasitic diode 63 performs the same function that diode 11 performed in the circuit of FIGS. 3a-d. However, the parasitic diode 63 typically has much poorer switching characteristics and suffers from higher switching losses than a standard high-voltage diode, resulting in increased power loss, so the circuit of FIGS. 3a-d is usually preferred.

Many power switching circuits contain one or more high-side or low-side switches. One example is the boost-mode power-factor correction circuit shown in FIG. 4a, which contains a low-side switch. This circuit is used at the input end in AC-to-DC voltage conversion circuits. The configuration for the low-side switch in this circuit is slightly modified from that shown in FIG. 1a, since in FIG. 1a the freewheeling diode 11 is connected anti-parallel to the inductive load 10, whereas in this circuit the freewheeling diode 11 is between the inductive load 30 and the output capacitor 35. However, the fundamental operating principles of the two circuits are the same. As seen in FIG. 4b, when switching device 12 is biased high, current 13 passes through the load 30 and through the switching device 12. The voltage at the cathode end of the freewheeling diode 11 is kept sufficiently high by the output capacitor 35 so that the freewheeling diode 11 is reverse-biased, and thereby does not have any significant current passing through it. As seen in FIG. 4c, when switching device 12 is switched low, the inductor forces the voltage at the anode of the freewheeling diode 11 to be sufficiently high such that the freewheeling diode 11 is forward biased, and the current 13 then flows through the inductive load 30, the freewheeling diode 11, and the output capacitor 35. Because no significant current can flow in the reverse direction in a diode, diode 11 prevents discharge of the output capacitor 35 through switching device 12 during times where the load current is zero or negative, as can occur if the energy stored in the inductor 30 is completely transferred out before the commencement of the next switching cycle.

SUMMARY

In one aspect, a switch is described that includes a first switching device in series with an assembly comprising a load and a second switching device, the first switching device including a first channel, the second switching device including a second channel, wherein in a first mode of operation the second switching device is capable of blocking a voltage applied across the second switching device in a first direction, in a second mode of operation a substantial current flows through the second channel of the second switching device when a voltage is applied across the second switching device in a second direction and a gate of the second switching device is biased below a threshold voltage of the second switching device, and in a third mode of operation a substantial current flows through the second channel of the second switching device when a voltage is applied across the second switching device in the second direction and the gate of the second switching device is biased above the threshold voltage of the second switching device.

The switch or the assembly can be free of any diodes.

In another aspect, a method of operating a switch is described. At a first time, a gate of a first switching device of a switch is biased higher than a threshold voltage of the first switching device and a gate of a second switching device is biased lower than a threshold voltage of the second switching device, allowing current to flow from a high voltage side of the switch to a low voltage or ground side of the switch through the load. At a second time immediately following the first time, a bias on the gate of the first switching device is changed to be lower than the threshold voltage of the first switching device, causing the second switching device to operate in diode mode and blocking current from flowing to ground. At a third time immediately following the second time, a bias on the gate of the second switching device is changed to be higher than the threshold voltage of the second switching device, wherein changing the bias at the third time reduces conduction loss in comparison to switch operation between the second time and the third time.

In another aspect, a boost-mode power-factor correction circuit is described. The circuit includes a first switching device comprising a first channel, an inductive load, a capacitor, and a second switching device comprising a second channel, wherein the first switching device is connected to a node between the inductive load and a floating gate drive circuit, the second switching device is configured to be connected to the floating gate drive circuit, and the second switching device is between the inductive load and the capacitor.

In yet another aspect, a method of operating the boost-mode power-factor correction circuit is described. The method includes causing a load current through the inductive load to be continuous; at a first time, biasing a gate of the first switching device higher than a threshold voltage of the first switching device and biasing a gate of the second switching device lower than a threshold voltage of the second switching device, allowing current to flow through the first switching device; at a second time immediately following the first time, changing a bias on the gate of the first switching device to be lower than the threshold voltage of the first switching device, causing the first switching device to operate in blocking mode and the second switching device to operate in diode mode, allowing current to flow through the second switching device; at a third time immediately following the second time, changing a bias on the gate of the second switching device to be higher than the threshold voltage of the second switching device, wherein changing the bias at the third time reduces conduction loss in comparison to switch operation between the second time and the third time.

In another aspect, a method of operating the boost-mode power-factor correction circuit is described. The method includes causing a load current through the inductive load to be discontinuous, sensing the load current, and when the load current approaches zero, changing a bias on a gate of the second switching device from a voltage higher than a threshold voltage of the second switching device to a voltage lower than the threshold voltage of the second switching.

In yet another aspect a method of operating the boost-mode power-factor correction circuit is described. The method includes sensing a load current passing through the inductive load, causing the load current to approach zero and immediately increase after approaching zero, and when the load current approaches zero, switching the second switching device from on to off and switching the first switching device from off to on.

In some embodiments, the following features are present. The first mode of operation can comprise biasing the gate of the first switching device above a threshold voltage of the first switching device. The second mode of operation can comprise biasing the gate of the first switching device below a threshold voltage of the first switching device. The first switching device can have a first terminal and a second terminal on opposite sides of the gate, and the first terminal can be adjacent to the assembly and at a higher voltage than the second terminal of the first switching device during operation. The first switching device can have a first terminal and a second terminal on opposite sides of the gate, and the first terminal can be adjacent to the assembly and at a lower voltage than the second terminal of the first switching device during operation. A first node can be between the assembly and the first switching device, a second node can be at a high voltage side of the switch, and the second switching device can be capable of blocking a voltage when voltage at the first node is lower than voltage at the second node. A first node can be between the assembly and the first switching device, a second node can be at a low voltage or ground side of the switch, and the second switching device can be capable of blocking a voltage when voltage at the first node is higher than voltage at the second node. The second switching device can be capable of blocking a same voltage as the first switching device is capable of blocking The second switching device can be capable of blocking voltage in two directions. When the gate of the first switching device is biased lower than a threshold voltage of the first switching device, the second switching device can be capable of conducting current. When the gate of the first switching device is biased lower than the threshold voltage of the first switching device, substantially all current can flow through a single primary channel of the second switching device. When the gate of the second switching device is biased higher than the threshold voltage of the second switching device, the voltage drop across the second switching device can be reduced as compared to when the gate of the second switching device is biased lower than the threshold voltage of the second switching device. The second switching device can have a positive threshold voltage. The first switching device can have a positive threshold voltage. The second switching device can be a HEMT. The second switching device can be a III-Nitride HEMT. The first switching device can be a HEMT. The first switching device can be a III-Nitride HEMT. The second switching device can be structurally the same as the first switching device. A voltage drop across the second switching device can be smaller in the third mode of operation as compared to in the second mode of operation. The load can be an inductive load. The first switching device or the second switching device can comprise a high-voltage depletion mode device and a low-voltage enhancement mode device, the second channel can be a channel of the high-voltage depletion mode device, and the threshold voltage of the second switching device can be a threshold voltage of the low-voltage enhancement mode device. The low-voltage enhancement mode device can at least block a voltage equal to an absolute value of a threshold voltage of the high-voltage depletion mode device. The high-voltage depletion mode device can be a III-Nitride HEMT. The low-voltage enhancement mode device can be a III-Nitride HEMT. The low-voltage enhancement mode device can be a Si MOS device. The device can include a diode connected antiparallel to the low-voltage enhancement mode device. The first switching device can comprise a high-voltage depletion mode device and a low-voltage enhancement mode device, the first channel can be a channel of the high-voltage depletion mode device, and a threshold voltage of the first switching device can be a threshold voltage of the low-voltage enhancement mode device.

Boost-mode power-factor correction circuits can include one or more of the following features. The first switching device can be a III-N HEMT. The second switching device can be a III-N HEMT.

Operating a boost-mode power-factor correction circuit can include causing a load current through the inductive load to be discontinuous, sensing the load current, and when the load current approaches zero, changing a bias on a gate of the second switching device from a voltage higher than a threshold voltage of the second switching device to a voltage lower than the threshold voltage of the second switching device. A load current passing through the inductive load, causing the load current to approach zero and immediately increase after approaching zero is sensed. When the load current approaches zero, the second switching device is switched from on to off and the first switching device is switched from off to on.

Methods described herein may include one or more of the following features or steps. Changing the bias at the third time can reduce conduction loss in comparison to switch operation at the second time.

DETAILED DESCRIPTION

Figure 1:
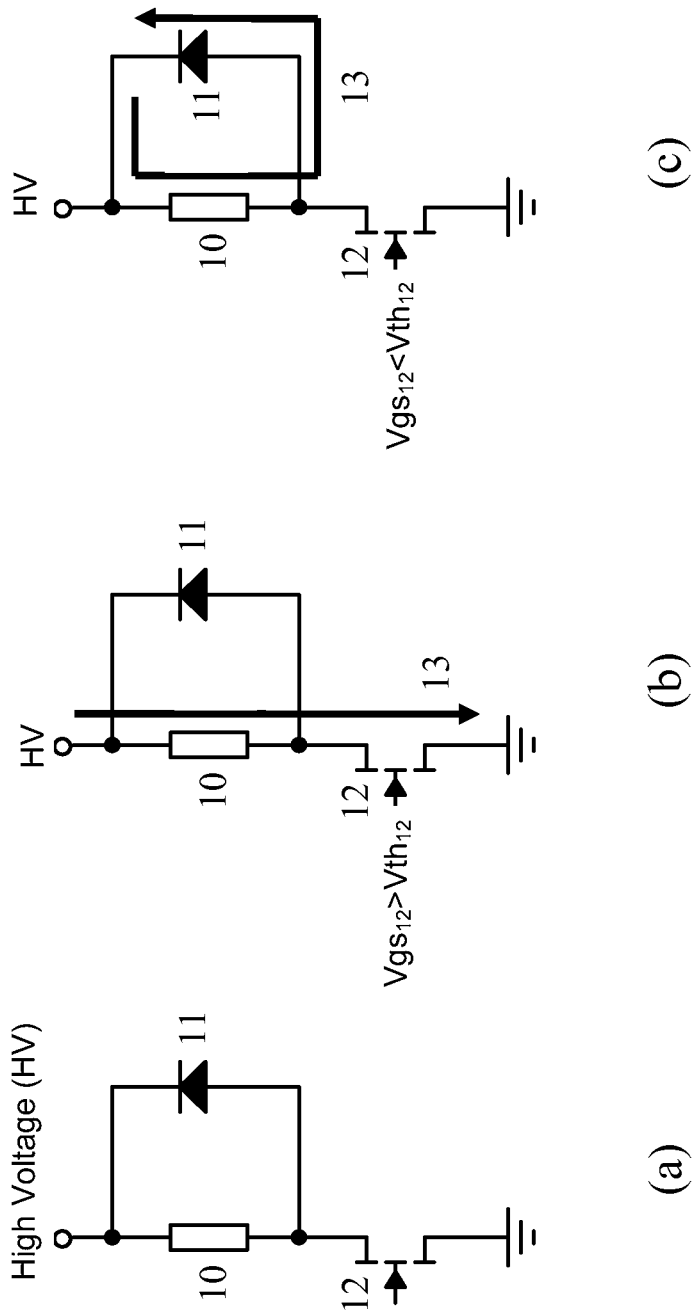
FIGS. 1a-c show schematics of a low-side switch, and current paths for various bias conditions.
Figure 2:
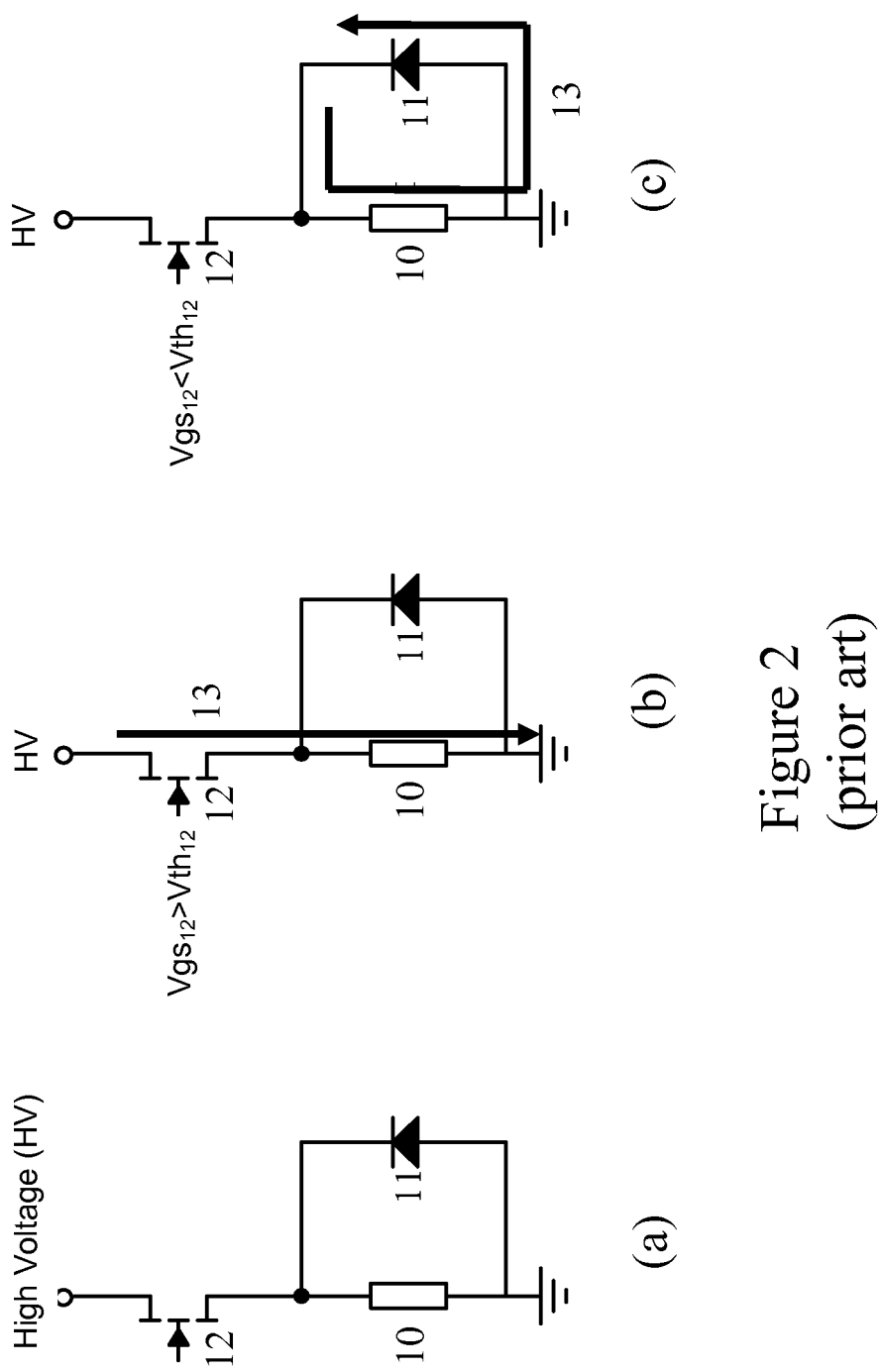
FIGS. 2a-c show schematics of a high-side switch, and current paths for various bias conditions.
Figure 3:
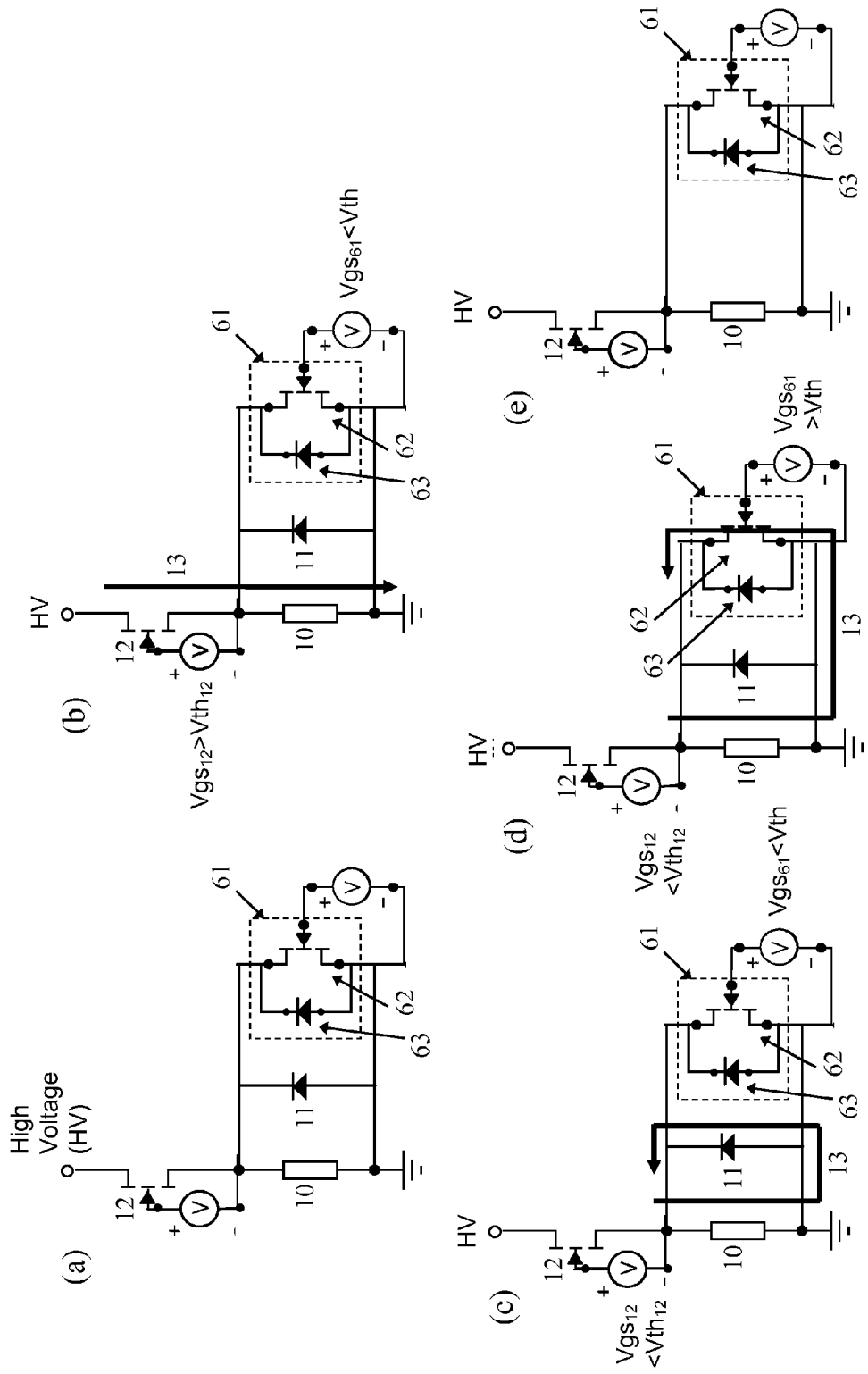
FIGS. 3a-e show schematics of high-side switches with a MOSFET connected across the inductive load, and current paths for various bias conditions.

Low-side and high-side switches and the circuits which they comprise, wherein the freewheeling diode shown in FIGS. 1-3 is replaced by a switching device, such as a transistor, are described below. Embodiments are shown in FIGS. 5a and 6a, wherein FIG. 5a comprises a low-side switch, and FIG. 6a comprises a high-side switch. In FIGS. 5a and 6a, the freewheeling diode used in the circuits of FIGS. 1 and 2 has been replaced by switching device 41. In some embodiments, this device may be the same as the switching device 42 used to modulate the current path. FIGS. 5b and 6b illustrate the current path when switching device 42 is biased ON (high) and switching device 41 is biased OFF (low). FIGS. 5c and 6c illustrate the current path when switching device 42 is switched OFF. Switching device 41 can be an enhancement mode device, where the threshold voltage $V_{th}>0$, or a depletion mode device, where the threshold voltage $V_{th}<0$. In high power applications, it is desirable to use enhancement mode devices with threshold voltages as large as possible, such as $V_{th}>2V$ or $V_{th}>3V$, a high internal barrier from source to drain at 0 bias (such as 0.5-2 eV), a high ON-to-OFF current ratio (such as $>10^5$), along with high breakdown voltage (600/1200 Volts) and low on resistance (<5 or <10 mohm-cm$^2$ for 600/1200 V respectively).

Additionally, switching device 41 must have the following characteristics. It must be able to block significant voltage when the voltage at terminal 45/55 is lower than the voltage at terminal 46/56. This condition occurs when switching device 42 is biased high, as shown in FIGS. 5b and 6b. As used herein, "blocking a voltage" refers to the ability of a transistor to prevent a current that is greater than 0.0001 times the operating current during regular conduction from flowing through the transistor when a voltage is applied across the transistor. In other words, while a transistor is blocking a voltage which is applied across it, the total current passing through the transistor will not be greater than 0.0001 times the operating current during regular conduction. As used herein, "substantial current" includes any current which is at least ten percent of the operating current during regular conduction. The maximum voltage that switching device 41 must be able to block depends on the particular circuit application, but in general will be the same or very close to the maximum blocking voltage specified for switching device 42. In some embodiments, switching device 41 is able to block voltage in both directions. When switching device 42 is switched OFF, switching device 41 must be capable of conducting current 13 in the direction shown in FIGS. 5c and 6c. Furthermore, when the circuit is biased such as shown in FIG. 5c or 6c, all substantial current through switching device 41 flows through a single, primary channel of the device, wherein the conductivity of this channel may be modulated by the gate electrode. This is different from the circuits in FIGS. 3a-3e, for which applying a voltage signal to the gate electrode of device 61 causes the current to shift from one channel (that of diode 11 or 63) to that of the transistor 62. The maximum current that switching device 41 must be able to conduct in this direction depends on the particular circuit application, but in general will be the same or very close to the maximum current specified for switching device 42. In some embodiments, the switching devices are able to conduct current in both directions.

Figure 5:
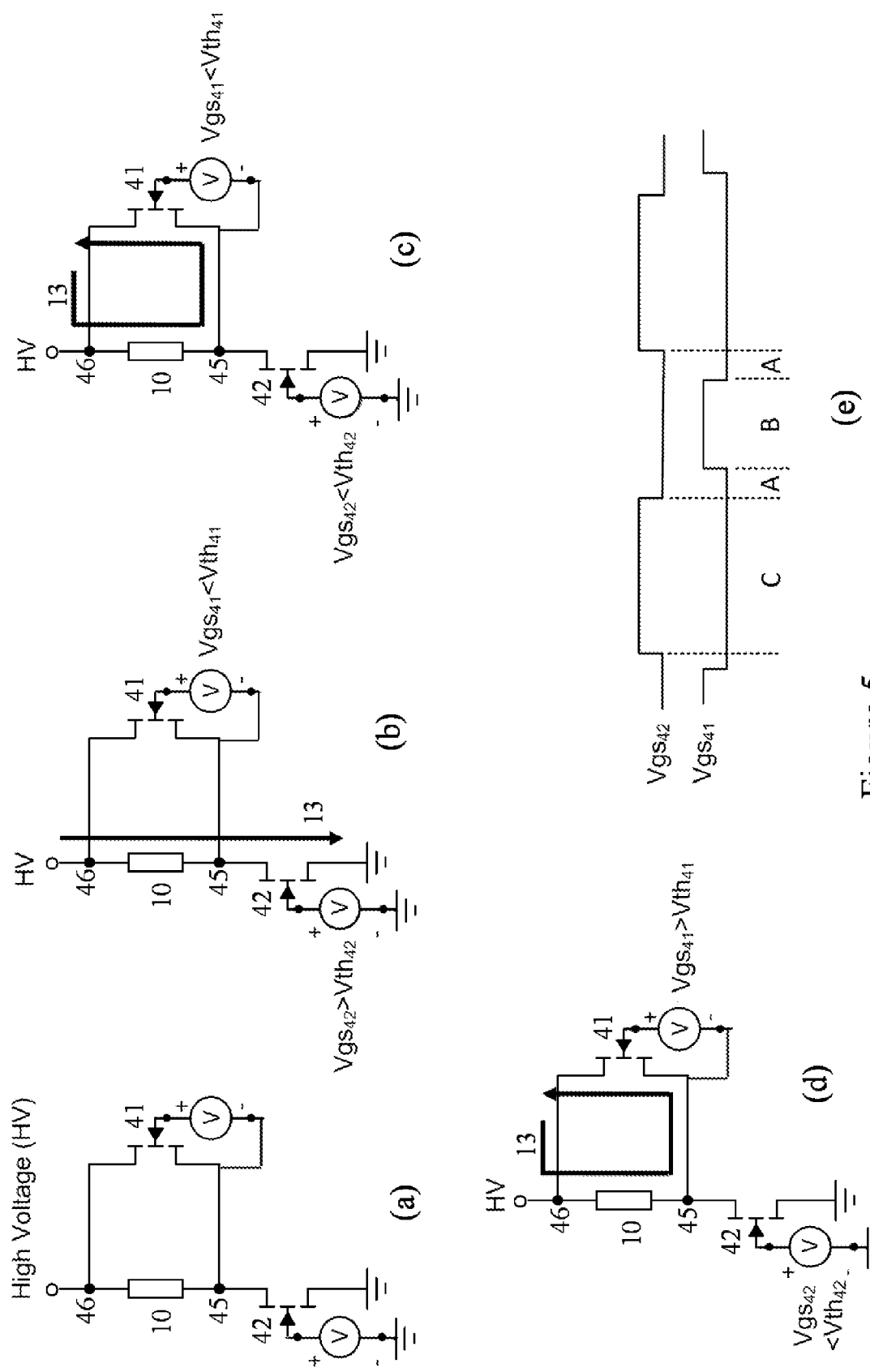
FIGS. 5a-d show schematics of a low-side switch, along with current paths for various bias conditions.
FIG. 5e shows a biasing scheme for the switching devices in the circuits of FIGS. 5a-d.

The detailed operation of the circuit in FIG. 5 is as follows. When switching device 42 is biased ON, such as by setting the gate-source voltage $V_{GS42}$ greater than the device threshold voltage $V_{th42}$, and switching device 41 is biased OFF, such as by setting $V_{GS41} < V_{th41}$, current 13 flows through inductive load 10 and switching device 42, as seen in FIG. 5b. Here, switching device 41 is said to be in "blocking mode", as it is supporting a voltage across it while at the same time blocking current from flowing through it, i.e., device 41 is blocking voltage. As shown in FIG. 5c, when switching device 42 is switched OFF, the current through the inductive load 10 cannot change abruptly, so the voltage at terminal 45 is forced sufficiently high to allow the freewheeling current 13 to be carried through switching device 41. Note that in this mode of operation, current is able to flow through switching device 41 even if $V_{GS41}$ is not changed. This mode of operation for switching device 41 is known as "diode mode operation". The circuit of FIG. 5 may be preferable to that of FIG. 1 because transistors suitable for use in this application typically have lower conduction and switching losses than diode 11.

Depending on the current level and the threshold voltage of switching device 41, the power dissipation through this device could be unacceptably high when operating in the diode mode. In this case, a lower power mode of operation may be achieved by applying a voltage $V_{GS41} > V_{th41}$ to the gate of switching device 41, as shown in FIG. 5d. To prevent shoot-through currents from the high-voltage supply (HV) to ground, gate signals of the form shown in FIG. 5e are applied. The time during which switching device 42 is ON and switching device 41 is OFF is labeled "C" in FIG. 5e. This corresponds to the mode of operation shown in FIG. 5b. When switching device 42 is switched OFF, during the time switching device 41 conducts the freewheeling current, the gate of switching device 41 is driven high, allowing the drain-source voltage of switching device 41 to be simply the on-state resistance ($R_{ds-on}$) times the load current. To avoid shoot-through currents from the high-voltage supply (HV) to ground, some dead time must be provided between turn-off of switching device 42 and turn-on of switching device 41. These are the times labeled "A" in FIG. 5e. During these dead times, switching device 41 operates in the diode mode described above. Since this is a short time in comparison with the entire switching cycle, the relative amount of total power dissipation is low. Time "B" provides the dominant loss factor for switching device 41, and this corresponds to the low-power mode when switching device 41 is fully enhanced. The mode of operation illustrated in FIG. 5d allows for a further reduction in conduction loss, although switching losses remain unaffected.

In the circuit of FIG. 5, when switching device 42 is switched OFF, all substantial current flows through the primary channel of switching device 41 when the gate of switching device 41 remains low (FIG. 5c) as well as when it is driven high (FIG. 5d). This may be preferable to the operation of the circuit in FIG. 3, for which substantial current initially flows through a diode while transistor 61 remains low and only flows through the primary transistor channel once the gate of transistor 61 is driven high. Diode 11 and parasitic diode 63 in FIG. 3 typically exhibit higher switching losses than transistors 41 suitable for use in the circuit of FIG. 5. Additionally, switching devices 41 and 42 in FIG. 5 can be identical or similar devices, which simplifies the fabrication of this circuit.

Figure 6:
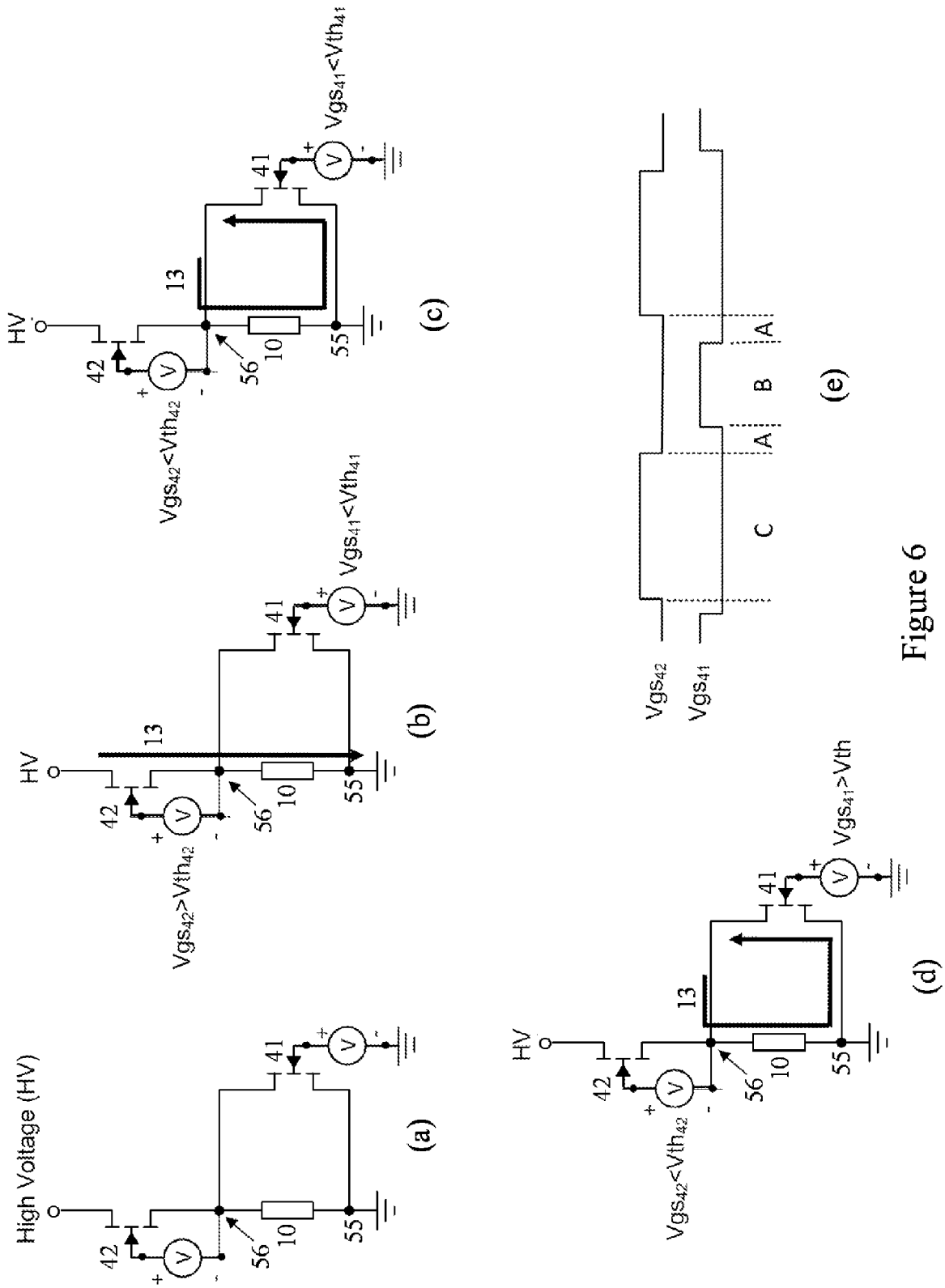
FIGS. 6a-d show schematics of a high-side switch, along with current paths for various bias conditions.
FIG. 6e shows a biasing scheme for the switching devices in the circuits of FIGS. 6a-d.

The detailed operation of the circuit in FIG. 6 is similar to that of FIG. 5. When switching device 42 is biased ON, such as by setting $V_{GS42} > V_{th42}$, and switching device 41 is biased OFF, such as by setting $V_{GS41} < V_{th41}$, current 13 flows through inductive load 10 and switching device 42, as seen in FIG. 6b. As shown in FIG. 6c, when switching device 42 is switched OFF, the current through the inductive load 10 cannot change abruptly, so the voltage at terminal 56 is forced sufficiently negative to allow the freewheeling current 13 to be carried through switching device 41, and switching device 41 now operates in diode mode. Again, in this mode of operation, current is able to flow through switching device 41 even if $V_{GS41}$ is not changed. As with the circuit of FIG. 5, power dissipation during diode mode operation of switching device 41 may be reduced by applying a voltage $V_{GS41} > V_{th41}$ to the gate of switching device 41, as shown in FIG. 6d. Again, some dead time must be provided between turn-off of switching device 42 and turn-on of switching device 41 in order to avoid shoot-through currents from the high-voltage supply (HV) to ground, and so the bias scheme shown in FIG. 6e is used.

Examples of devices that meet the criteria specified above for switching device 41 are metal-semiconductor field effect transistors (MESFETs) of any material system, junction field effect transistors (JFETs) of any material system, high electron mobility transistors (HEMTs or HFETs) of any material system, including vertical devices such as current aperture vertical electron transistors (CAVETs), and bidirectional switches comprised of the devices listed above, such as those described U.S. application Ser. No. 12/209,581, filed Sep. 12, 2008, which is hereby incorporated by reference throughout. Common material systems for HEMTs and MESFETs include $Ga_xAl_yIn_{1-x-y}N_mAs_nP_{1-m-n}$ or III-V materials, such as III-N materials, III-As materials, and III-P materials. Common materials for JFETs include III-V materials, SiC, and Si.

Preferably, switching device 41 is an enhancement mode device to prevent accidental turn on, in order to avoid damage to the device or other circuit components. III-Nitride (III-N) devices, such as III-Nitride HFETs, are especially desirable due to the large blocking voltages that can be achieved with these devices. The device preferably also exhibits a high access region conductivity (such as sheet resistance <750 ohms/square) along with high breakdown voltage (600/1200 Volts) and low on resistance (<5 or <10 mohm-cm$^2$ for 600/1200 V respectively). The device can also include any of the following: a surface passivation layer, such as SiN, a field plate, such as a slant field plate, and an insulator underneath the gate. In other embodiments, switching device 41 is a SiC JFET.

Figure 7:
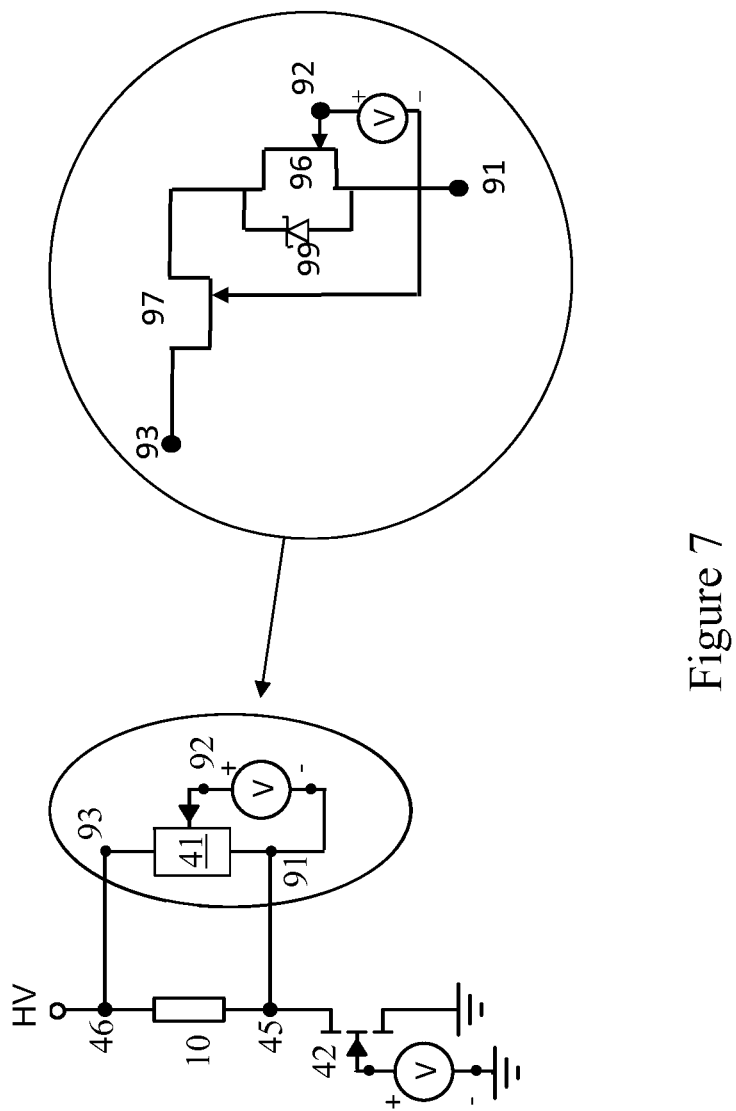
FIG. 7 shows a schematic of a low-side switch.

A variation on switching device 41, which can be used with any of the embodiments described herein, embodiment is shown in FIG. 7. In this embodiment, switching device 41 includes a high-voltage depletion mode (D-mode) device 97 connected to a low-voltage enhancement mode (E-mode) device 96 as shown. This configuration for switching device 41 operates similarly to the case when a high-voltage E-mode device is used for switching device 41. When the voltage at node 46 is higher than that at node 45 and the gate of E-mode device 96 is biased at 0V or below the threshold voltage of E-mode device 96, D-mode device 97 blocks the voltage across the switch. This configuration can be advantageous because high-voltage E-mode devices are typically difficult to fabricate. The D-mode device 97 is capable of blocking the maximum voltage drop across the switch, which for high-voltage applications can be 600V or 1200V or other suitable blocking voltage required by the application. Typical D-mode device threshold voltages for high-voltage devices are about −5 to −10V (D-mode=negative $V_{th}$). The E-mode device 96 can block at least $|V_{th}|$, where $|V_{th}|$ is the magnitude (absolute value) of the threshold voltage of the D-mode device. In some embodiments the E-mode device can block about $2*|V_{th}|$. In some embodiments, the D-mode device can block about 1200V and has a threshold voltage of about −5V, and the E-mode device blocks at least about 5V, such as at least about 10V. D-mode device 97 can be a high-voltage III-N HEMT device, and E-mode device 96 can be a Si MOS device or a III-N HEMT device. When a Si MOS device is used for device 96, diode 99, which is a low-loss diode such as Schottky diode, can optionally be connected antiparallel to device 96, as shown, in order to reduce switching losses by preventing turn-on of the parasitic reverse diode inherent in Si MOSFETs. A similar configuration to the one shown for switching device 41 in FIG. 7 can also be used for switching device 42, and the configuration may also be used for switching devices 41 and 42 in the high-side switch of FIG. 6. More details of the operation of this configuration can be found in U.S. application Ser. No. 12/209,581.

Figure 4:
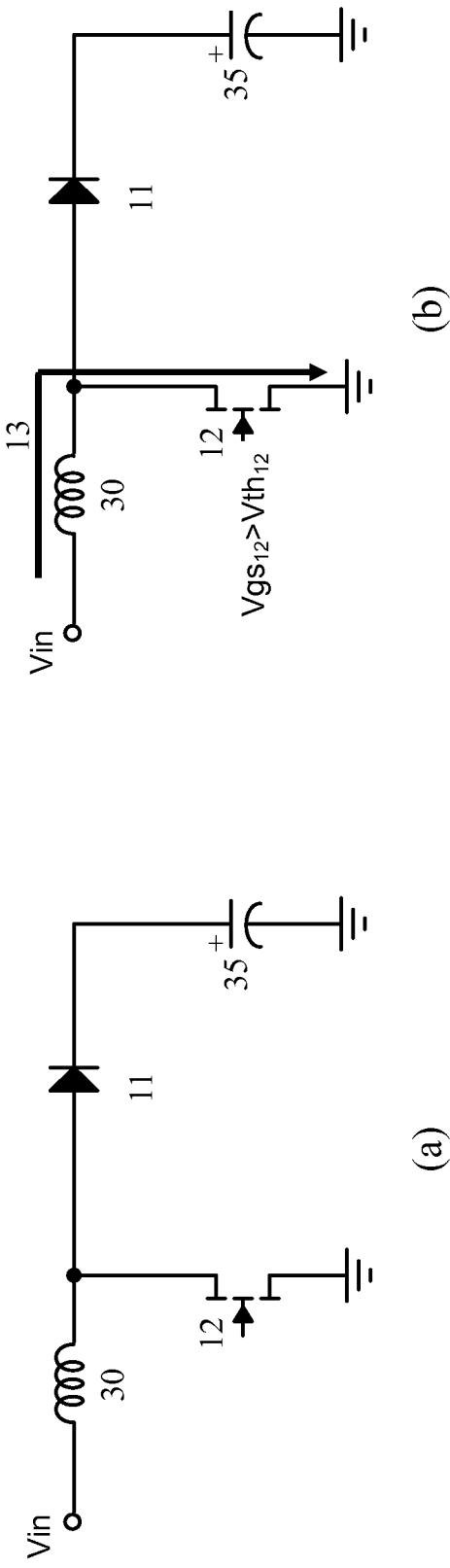
FIGS. 4a-c show schematics of a boost-mode power-factor correction circuit and current paths for various bias conditions.
Figure 4:
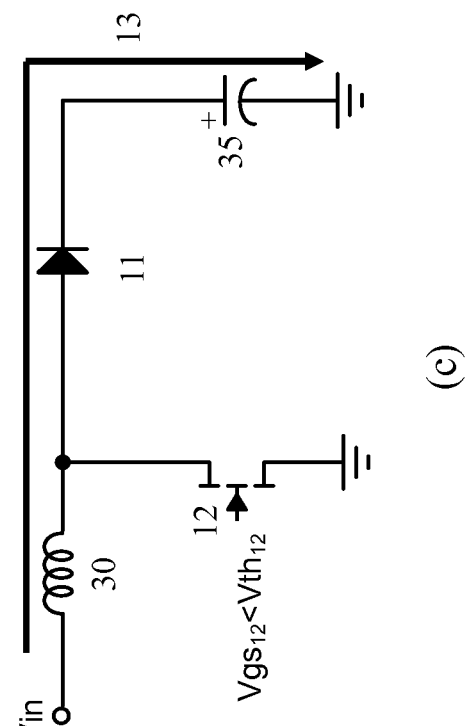
Figure 8:
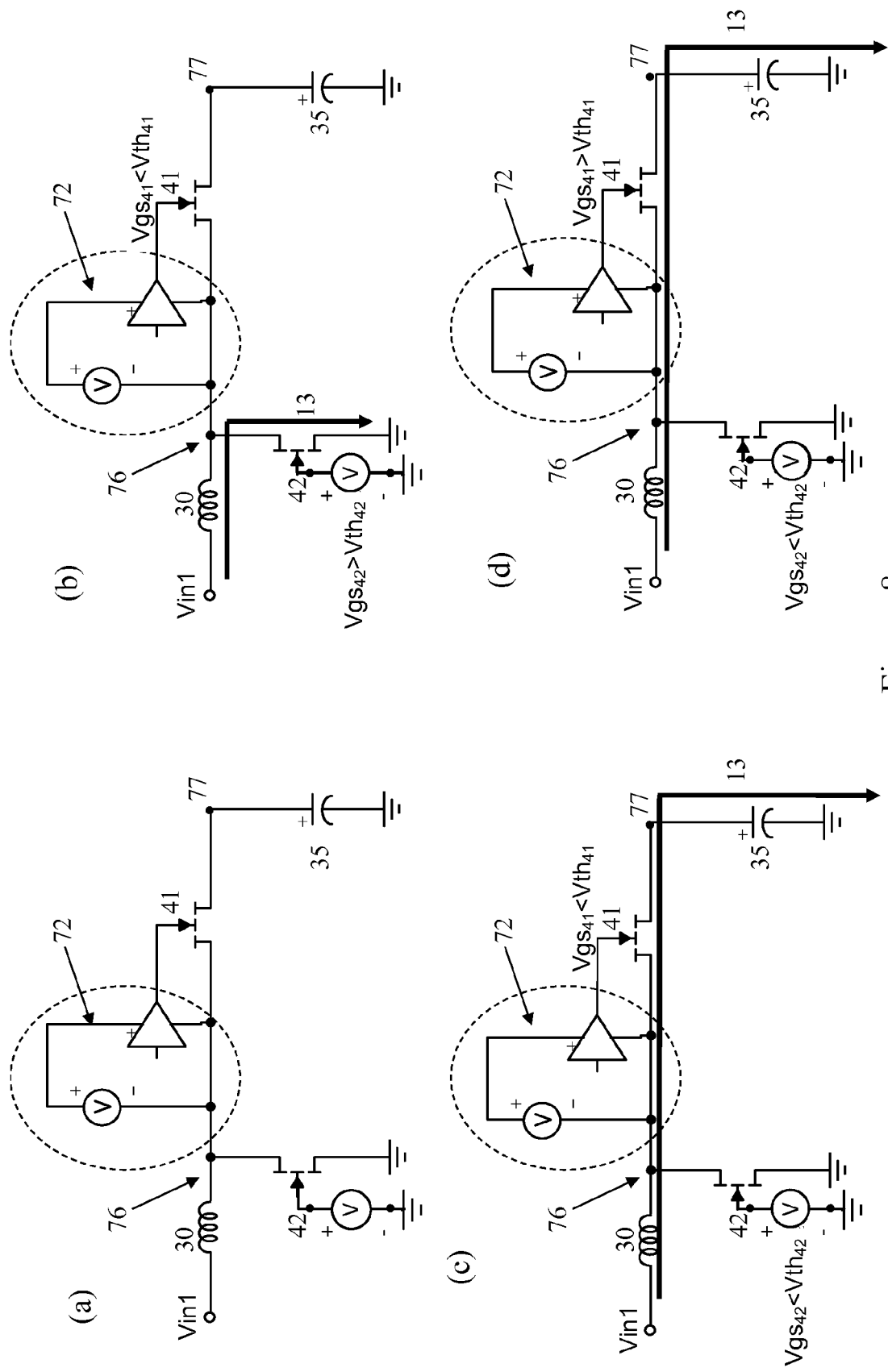
FIGS. 8a-d show schematics of a boost-mode power-factor correction circuit, along with current paths for various bias conditions.
FIG. 8e shows a biasing scheme for the switching devices in the circuits of FIGS. 8a-d.
Figure 8:
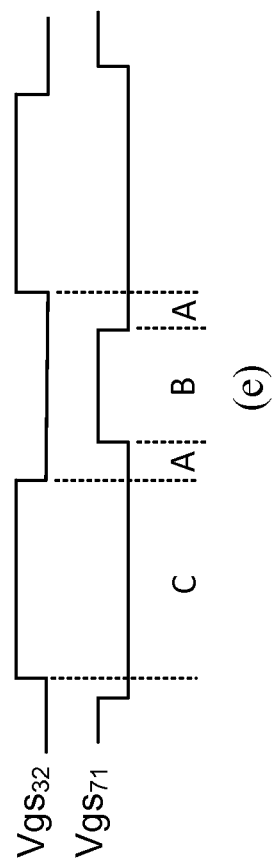

A boost-mode power-factor correction circuit is shown in FIG. 8a. This circuit is similar to that shown in FIG. 4a, except that diode 11 has been replaced by a switching device 41 connected to a floating gate-drive circuit 72. Switching device 41 must meet the same specifications as switching device 41 in FIGS. 5 and 6. The details of operation of this circuit are as follows. When switching device 42 is biased ON and switching device 41 is biased OFF, as seen in FIG. 8b, current 13 passes through the load 30 and through the switching device 42. The voltage at node 77 is kept sufficiently high by the output capacitor 35 so that switching device 41 is in blocking mode, and thereby does not have any substantial current passing through it. As seen in FIG. 8c, when switching device 42 is switched OFF, the inductor forces the voltage at node 76 to be sufficiently high such that switching device 41 switches to diode mode, and the current 13 then flows through the inductive load 30, switching device 41, and the output capacitor 35.

Figure 9:
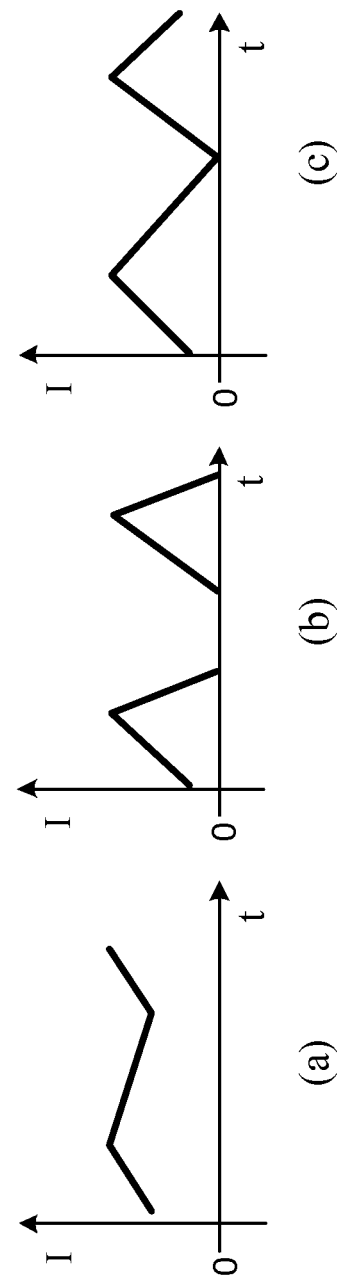
FIGS. 9a-c show the input current as a function of time for various operating conditions for the circuit in FIG. 8.

As with the circuits in FIGS. 5 and 6, conduction losses in this circuit can be reduced by applying a voltage $V_{GS41} > V_{th41}$ to the gate of switching device 41, as shown in FIG. 8d. However, for this circuit to operate properly, the timing of the signals applied by gate-drive circuit 72 to the gate of switching device 41 must be properly controlled. There are three cases which need to be considered independently. The first, illustrated in FIG. 9a, is the case where the load current is continuous (continuous mode). The second, illustrated is FIG. 9b, is the case where the load current is discontinuous (discontinuous mode), such that no current flows during some portion of the duty cycle. For this second case, it is also possible that the load current is negative (flows in the opposite direction through the load) during some portion of the duty cycle. This may occur if there are any inductive or capacitive components leading into the input of this circuit. The third, illustrated in FIG. 9c, is the case where the load current approaches zero but then immediately increases again. This mode is known as the "critical mode".

If the load current is continuous, then the timing of the gate signals to switching devices 42 and 41 is similar to that of the circuits in FIGS. 5 and 6. To allow the load current to flow through switching device 42, switching device 42 is switched ON and switching device 41 is switched OFF, as in FIG. 8b. When switching device 42 is switched OFF, the inductor forces the load current through switching device 41 as shown in FIG. 8c, and switching device 41 is in diode mode. While current flows through switching device 41, conduction losses can be reduced by applying a voltage $V_{GS41} > V_{th41}$ to the gate of switching device 41, as shown in FIG. 8d. Some dead time must be provided between turn-off of switching device 42 and turn-on of switching device 41 in order to prevent the capacitor 35 from discharging through switching devices 42 and 41, and so the bias scheme shown in FIG. 8e is used.

The current in the inductor can become discontinuous or negative if the energy stored in it is completely transferred, either to the output capacitor or through switching device 42, before the commencement of the next switching cycle. In circuits where the switching device 41, or flyback transistor, is connected in parallel to the load, such as those in FIGS. 5 and 6, there is no harm in leaving the flyback transistor enhanced even after the load current has dropped to zero. However, in the power factor correction circuit of FIG. 8, where the flyback transistor is between inductor 30 and capacitor 35, incorrect operation would result from leaving switching device 41 enhanced after the load current drops to zero, because the current would reverse sign and start discharging the output capacitor. In such a system, the load current must be sensed, either directly or indirectly, and if switching device 41 is on, it must be turned off when the current approaches zero. For example, switching device 41 can be turned off once the current has dropped to 0.1%, 1%, 3%, or 5% of the peak current.

The third case, the critical mode, is essentially the same as the discontinuous mode, with the difference that the switching device 42 turns back on as soon as the load current approaches zero. This implies that the switching frequency is not fixed, but adjustable, as in a hysteretic controller. The control circuit is therefore very different from the discontinuous case, but the requirement regarding the switching sequence of the switching devices 42 and 41 is the same. The current must be sensed to know when it has approached zero, and switching device 41 must be turned off when the current approaches zero.

What is claimed is:

1. A power-factor correction circuit, comprising:
   a first switching device comprising a first channel;
   an inductive load;
   a capacitor; and
   a second switching device comprising a second channel; wherein
   the first switching device is connected to a node between the inductive load and a floating gate drive circuit, the second switching device is configured to be connected to the floating gate drive circuit, and the second switching device is between the inductive load and the capacitor; and
   the power-factor correction circuit is configured such that in a first mode of operation the second switching device blocks a voltage applied across the second switching device in a first direction, in a second mode of operation a substantial current flows through the second channel when a voltage is applied across the second switching device in a second direction and a gate of the second switching device is biased below a threshold voltage of the second switching device, and in a third mode of operation a substantial current flows through the second channel when a voltage is applied across the second switching device in the second direction and the gate of the second switching device is biased above the threshold voltage of the second switching device.

2. The power-factor correction circuit of claim 1, wherein the first switching device comprises a III-N HEMT.

3. The power-factor correction circuit of claim 1, wherein the second switching device comprises a III-N HEMT.

4. The power-factor correction circuit of claim 1, wherein the second switching device comprises a high-voltage depletion mode device and a low-voltage enhancement mode device.

5. A power-factor correction circuit, comprising:
a first switching device comprising a first channel;
an inductive load;
a capacitor; and
a second switching device comprising a second channel; wherein
the first switching device is connected to a node between the inductive load and a floating gate drive circuit, the second switching device is configured to be connected to the floating gate drive circuit, and the second switching device is between the inductive load and the capacitor; and
the power-factor correction circuit is configured such that when a gate of the first switching device is biased higher than a threshold voltage of the first switching device, a gate of the second switching device is biased lower than a threshold voltage of the second switching device, and voltage at a node between the second switching device and the capacitor is sufficiently high to keep the second switching device in a blocking mode, current passes through the inductive load and through the first switching device.

6. A method of operating a power-factor correction circuit, the power-factor correction circuit comprising:
a first switching device comprising a first channel;
an inductive load;
a capacitor; and
a second switching device comprising a second channel; wherein
the first switching device is connected to a node between the inductive load and a floating gate drive circuit, the second switching device is configured to be connected to the floating gate drive circuit, and the second switching device is between the inductive load and the capacitor;
the method comprising:
at a first time, biasing a gate of the first switching device higher than a threshold voltage of the first switching device and biasing a gate of the second switching device lower than a threshold voltage of the second switching device, allowing current to flow through the first switching device;
at a second time following the first time, changing a bias on the gate of the first switching device to be lower than the threshold voltage of the first switching device, causing the first switching device to operate in blocking mode and the second switching device to operate in diode mode, allowing current to flow through the second channel of the second switching device; and
at a third time following the second time, changing a bias on the gate of the second switching device to be higher than the threshold voltage of the second switching device, wherein following the third time current continues to flow through the second channel of the second switching device.

7. The method of claim 6, wherein changing the bias at the third time reduces conduction loss in comparison to switch operation between the second time and the third time.

8. The method of claim 6, further comprising:
sensing a load current passing through the inductive load; and
when the load current approaches zero, changing the bias on the gate of the second switching device from a voltage higher than the threshold voltage of the second switching device to a voltage lower than the threshold voltage of the second switching device.

9. The method of claim 6, further comprising:
sensing a load current passing through the inductive load; and
when the load current approaches zero, switching the second switching device from on to off and switching the first switching device from off to on.

10. A power-factor correction circuit, comprising:
a first switching device comprising a first channel;
an inductive load;
a capacitor; and
a second switching device comprising a second channel; wherein
the first switching device is connected to a node between the inductive load and a floating gate drive circuit, the second switching device is configured to be connected to the floating gate drive circuit, and the second switching device is between the inductive load and the capacitor; and
the first switching device or the second switching device comprises a high-voltage depletion mode device and a low-voltage enhancement mode device.

11. A power-factor correction circuit, comprising:
a first switching device comprising a first channel;
an inductive load;
a capacitor; and
a second switching device comprising a gate and a second channel; wherein
the first switching device is connected to a node between the inductive load and the second switching device, and the second switching device is between the inductive load and the capacitor; and
the first switching device or the second switching device comprises a high-voltage depletion mode device and a low-voltage enhancement mode device.

12. A power-factor correction circuit, comprising:
a first switching device comprising a first channel;
an inductive load;
a capacitor; and
a second switching device comprising a gate and a second channel; wherein
the first switching device is connected to a node between the inductive load and the second switching device, and the second switching device is between the inductive load and the capacitor; and
the power-factor correction circuit is configured such that in a first mode of operation the second switching device blocks a voltage applied across the second switching device in a first direction, in a second mode of operation a substantial current flows through the second channel when a voltage is applied across the second switching device in a second direction and a gate of the second switching device is biased below a threshold voltage of the second switching device, and in a third mode of operation a substantial current flows through the second channel when a voltage is applied across the second switching device in the second direction and the gate of the second switching device is biased above the threshold voltage of the second switching device.

13. The power-factor correction circuit of claim 12, wherein the second switching device is configured to be connected to a gate drive circuit.

14. The power-factor correction circuit of claim 12, wherein the first and second switching devices comprise III-N HEMTs.

15. The power-factor correction circuit of claim 12, wherein conduction losses in the circuit are reduced in the third mode of operation as compared to the second mode of operation.

16. A power-factor correction circuit, comprising:
a switching device comprising a first channel;
an inductive load;
a capacitor; and
a device comprising a transistor having a second channel; wherein
the switching device is connected to a node between the inductive load and the device, and the device is between the inductive load and the capacitor; and
the power-factor correction circuit is configured such that in a first mode of operation substantial current flows through the second channel when voltage is applied across the device in a first direction and a gate of the transistor is biased below a threshold voltage of the transistor, and in a second mode of operation substantial current flows through the second channel when voltage is applied across the device in the first direction and the gate of the transistor is biased above the threshold voltage of the transistor.

17. The power-factor correction circuit of claim 16, wherein the transistor is a III-N HEMT.

18. The power-factor correction circuit of claim 16, wherein the power-factor correction circuit is configured such that in a third mode of operation the device blocks a voltage applied across the device in a second direction.

19. The power-factor correction circuit of claim 16, wherein conduction losses in the circuit are reduced in the second mode of operation as compared to the first mode of operation.

20. The power-factor correction circuit of claim 16, wherein the transistor is a high-voltage depletion mode transistor, and the device further comprises a low-voltage enhancement mode transistor.

21. A method of operating a circuit comprising an inductive load, a first switching device, and a second switching device, the method comprising:
at a first time, biasing a gate of the first switching device higher than a threshold voltage of the first switching device and biasing a gate of the second switching device lower than a threshold voltage of the second switching device, allowing current to flow through the first switching device;
at a second time following the first time, changing a bias on the gate of the first switching device to be lower than the threshold voltage of the first switching device, causing the first switching device to operate in blocking mode and the second switching device to operate in diode mode, allowing current to flow through a channel of the second switching device; and
at a third time following the second time, changing a bias on the gate of the second switching device to be higher than the threshold voltage of the second switching device, wherein following the third time current continues to flow through the channel of the second switching device.

22. The method of claim 21, wherein the second switching device comprises a high-voltage depletion mode transistor and a low-voltage enhancement mode transistor.

23. The method of claim 22, wherein the high-voltage depletion mode transistor comprises a III-N HEMT.

24. The method of claim 23, wherein the low-voltage enhancement mode transistor comprises a Si MOS device or a III-N HEMT.

25. The method of claim 21, wherein the second switching device comprises a III-Nitride enhancement mode transistor.

26. The method of claim 21, wherein the circuit comprises a power-factor correction circuit.

27. The method of claim 21, wherein the first switching device is connected to a node between the inductive load and the second switching device.

28. The method of claim 27, the circuit further comprising a capacitor, wherein the second switching device is between the inductive load and the capacitor.

* * * * *

UNITED STATES PATENT AND TRADEMARK OFFICE
CERTIFICATE OF CORRECTION

PATENT NO. : 8,493,129 B2
APPLICATION NO. : 13/618502
DATED : July 23, 2013
INVENTOR(S) : James Honea and Yifeng Wu It is certified that error appears in the above-identified patent and that said Letters Patent is hereby corrected as shown below:

On Title Page 1 (Other Publications), Column 2, Line 1: Delete "AlGan" and replace with --AlGan--;

On Title Page 3 (Other Publications), Column 2, Line 2: Delete "AlGan" and replace with --AlGan--;

On Title Page 4 (Other Publications), Column 1, Line 38: Delete "AlGan" and replace with --AlGan--;

On Title Page 4 (Other Publications), Column 1, Line 43: Delete "AlGan" and replace with --AlGan--;

On Title Page 4 (Other Publications), Column 1, Line 45: Delete "AlGan" and replace with --AlGan--;

On Title Page 4 (Other Publications), Column 1, Line 60: Delete "AlGan" and replace with --AlGan--;

On Title Page 4 (Other Publications), Column 1, Line 72: Delete "AlGan" and replace with --AlGan--;

On Title Page 4 (Other Publications), Column 2, Line 11: Delete "AlGan" and replace with --AlGan--;

On Title Page 4 (Other Publications), Column 2, Line 67: Delete "interiayers" and replace with --interlayers--;

On Title Page 5 (Other Publications), Column 1, Line 1: Delete "AlGan" and replace with --AlGan--;

Signed and Sealed this
Twelfth Day of November, 2013

Teresa Stanek Rea
*Deputy Director of the United States Patent and Trademark Office*

CERTIFICATE OF CORRECTION (continued)
U.S. Pat. No. 8,493,129 B2

On Title Page 5 (Other Publications), Column 1, Line 28: Delete "AlGan" and replace with --AlGan--; and On Title Page 5 (Other Publications), Column 1, Line 35: Delete "micowave" and replace with --microwave--.